(12) United States Patent
Tan et al.

(10) Patent No.: US 8,099,655 B1
(45) Date of Patent: Jan. 17, 2012

(54) GALOIS FIELD MULTIPLIER SYSTEM AND METHOD

(75) Inventors: Kuan Hua Tan, Coquitlam (CA); Amr Wassal, Burnaby (CA)

(73) Assignee: PMC-Sierra US, Inc., Sunnyvale, CA (US)

( * ) Notice: Subject to any disclaimer, the term of this patent is extended or adjusted under 35 U.S.C. 154(b) by 1061 days.

(21) Appl. No.: 11/961,494

(22) Filed: Dec. 20, 2007

(51) Int. Cl.
*H03M 13/00* (2006.01)
(52) U.S. Cl. ...................................... 714/781
(58) Field of Classification Search .................. 714/781, 714/784
See application file for complete search history.

(56) References Cited

U.S. PATENT DOCUMENTS

| | | | |
|---|---|---|---|
| 4,847,801 | A | 7/1989 | Tong |
| 5,379,243 | A | 1/1995 | Greenberger et al. |
| 5,502,665 | A | 3/1996 | Im |
| 5,570,378 | A * | 10/1996 | Inoue et al. ................... 714/785 |
| 5,689,452 | A | 11/1997 | Cameron |
| 5,768,168 | A | 6/1998 | Im |
| 6,038,581 | A | 3/2000 | Aoki et al. |
| 6,134,572 | A | 10/2000 | Wolf et al. |
| 6,141,786 | A * | 10/2000 | Cox et al. ...................... 714/763 |
| 6,286,123 | B1 * | 9/2001 | Kim ............................. 714/781 |
| 6,366,941 | B1 | 4/2002 | Wolf et al. |
| 6,467,063 | B1 * | 10/2002 | Fukuoka ........................ 714/784 |
| 6,473,779 | B1 * | 10/2002 | Wolf ............................. 708/492 |
| 6,550,035 | B1 * | 4/2003 | Okita ............................ 714/774 |
| 6,694,476 | B1 * | 2/2004 | Sridharan et al. ............. 714/781 |
| 6,701,336 | B1 * | 3/2004 | Shen et al. .................... 708/492 |
| 6,760,742 | B1 | 7/2004 | Hoyle |
| 6,766,345 | B2 | 7/2004 | Stein et al. |
| 6,871,315 | B2 * | 3/2005 | Seki ............................. 714/782 |
| 7,136,892 | B2 * | 11/2006 | Feuser ......................... 708/492 |
| 7,178,091 | B1 * | 2/2007 | Alon ............................ 714/784 |
| 7,313,583 | B2 * | 12/2007 | Porten et al. ................. 708/492 |
| 7,526,518 | B2 * | 4/2009 | Zhang et al. ................. 708/492 |
| 7,895,253 | B2 * | 2/2011 | Stein et al. ................... 708/492 |
| 8,024,551 | B2 * | 9/2011 | Wilson et al. ................ 712/220 |

* cited by examiner

*Primary Examiner* — James C Kerveros
(74) *Attorney, Agent, or Firm* — Curtis B. Behmann; Borden Ladner Gervais LLP

(57) ABSTRACT

A Galois Field multiplier circuit for multiplying two polynomials (multiplicands). The multiplier circuit can use any arbitrary primitive polynomial to preserve the Galois Field. The multiplier circuit includes at least one logic unit that receives as a first input one of the multiplicands and shift the multiplicand in question by 1 bit to the left. The logic unit receives as a second input a pre-determined primitive polynomial and multiplies the primitive polynomial by the highest bit of the multiplicand received at the other input of the logic unit. The bit-shifted multiplicand is XOR-ed with the primitive polynomial multiplied the highest bit of the multiplicand and the result of the XOR operation is provided to a second logic circuit that completes the multiplication of the two polynomials.

10 Claims, 3 Drawing Sheets

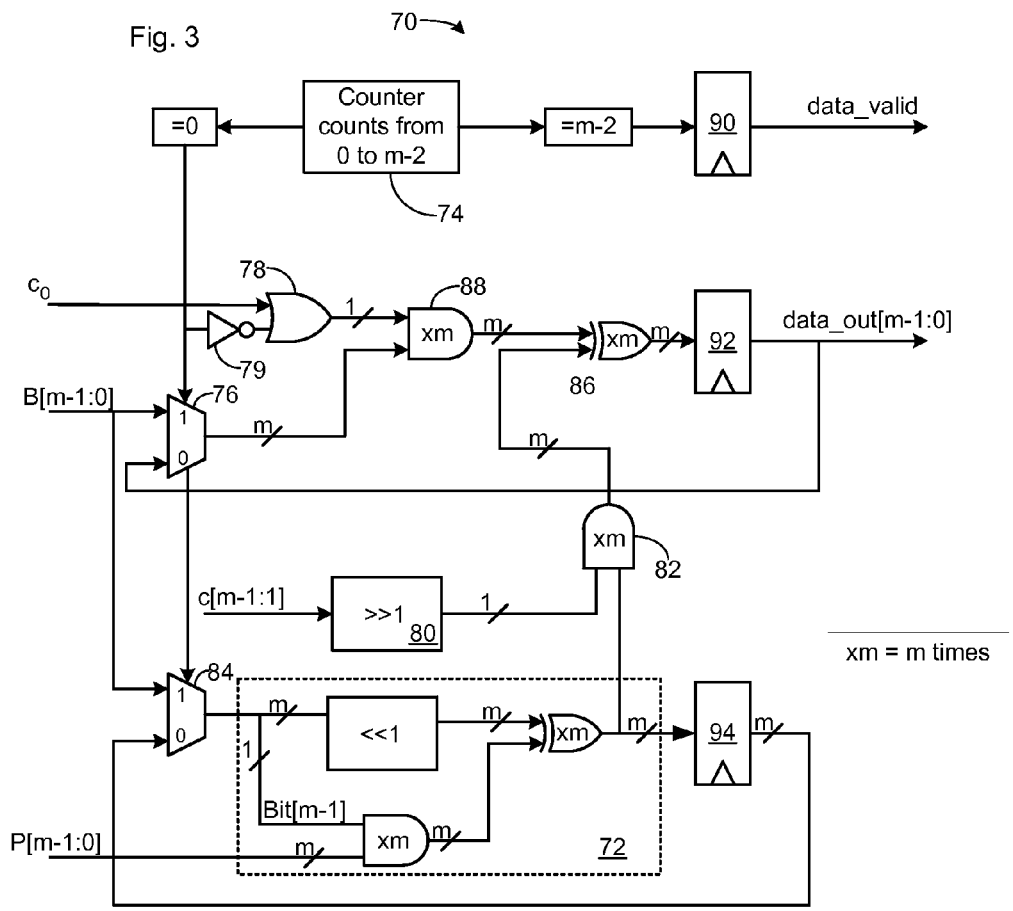

GALOIS FIELD MULTIPLIER SYSTEM AND METHOD

FIELD OF THE INVENTION

The present invention relates generally to Galois Field multiplication. In particular, the present invention relates to a Galois Field multiplication method and system that allows the multiplication of any two Galois field polynomials for any given primitive polynomial.

BACKGROUND OF THE INVENTION

In the field of computer storage, errors can occur when storing, transmitting, or receiving digital signals. These errors are practically unavoidable due to inherent noise present on the transmission media and the storing/receiving systems. To mitigate these errors, several methods, such as, for example, Reed Solomon coding, have been developed to detect and correct errors.

In the field of computer storage, there exists many Redundant Arrays of Inexpensive Disks (RAID) controller designs, most of which focus on RAID system design software and hardware techniques. The simple and basic way to RAID a system and prevent data lost is the "RAID level 1" configuration which simultaneously writes data to two storage units. The second storage unit is used to mirror the data store and used in the 1st storage unit; however this is very costly as 50% of the available storage units are used for backup storage.

As technology evolves with its plethora of small, inexpensive storage units with high storage capacity and high bandwidth, the technique of distributing data among multiple storage devices to achieve high bandwidth input/output with one or more error-correcting algorithms becomes increasingly important. The "RAID level 5" configuration, also called the "N+1 parity" technique, provides a simple solution to calculate the checksum by performing bitwise exclusive-or (XOR) of the data bytes distributed to all storage devices. If one of the N+1 devices fails, the data can be reconstructed by XOR-ing the data of the remaining N devices. N+1 parity is attractive because of its simplicity; however, it requires one extra storage device and one extra write operation per write to any single device. Its main disadvantage is that it cannot recover from more than one simultaneous storage device failure.

The "RAID level 6" configuration, or "p+q parity" technique, provides better error recovery by not only generating P checksum parity (p parity) as defined in RAID level 5, but also generating Q checksum parity (q parity) by adopting an error correction algorithm through Galois Field (GF) multiplication with a primitive polynomial. If any two of the N+2 devices fails, the failing devices can be reconstructed by using the P and Q checksums together with the remaining N devices. Generally, there are several known primitive polynomials available for GF multiplication with corresponding circuit implementations and methods that are either complicated or expensive to run or unavailable to for use.

As mentioned above, GF arithmetic is widely used in communication systems for Reed Solomon coding and also in Advanced Encryption Standard (AES) coding. While GF addition operations are straightforward, the same cannot be said of GF multiplication operations. The following provides an overview of GF operations.

GF arithmetic is a cyclic finite field arithmetic meaning that any operation performed on any two numbers within the field yields a number in the field, i.e., there is no arithmetic operation that can be done on any two numbers within the field that will produce a number outside of the field. Since digital systems transmit/store data in bits, which can only take on one of two values (0 or 1), grouping these bits together to build a symbol is common in digital systems and these groupings are all based on powers of two. Table 1 shows the relationship between the number of bits per symbol, the equivalent range of integers spanned by the number of bits, and the equivalent GF representation.

TABLE 1

Digital symbols vs. GF notation

| Number of bits per symbol | Range of integers | Galois Field representation |
|---|---|---|
| 1 | 0 to 1 | GF(2) |
| 2 | 0 to 3 | GF(4) |
| 3 | 0 to 7 | GF(8) |
| 4 | 0 to 15 | GF(16) |
| 5 | 0 to 31 | GF(32) |
| 6 | 0 to 63 | GF(64) |
| 7 | 0 to 127 | GF(128) |
| 8 | 0 to 255 | GF(256) |
| m | 0 to $(2^m - 1)$ | GF($2^m$) |

Galois field arithmetic uses the numbers shown in Table 1. For example, the range of integers from 0 to 7 (0, 1, 2, 3, 4, 5, 6, 7) has a Galois Field representation or notation of GF(8) because the Galois Field has 8 elements, while the range of integers 0 to 1 has a Galois Field of GF(2) because it has only two elements, etc.

There are many ways of representing numbers in the finite field of any given GF. Table 2 illustrates such representations of the values of the GF(8) in integer, binary and vector (or polynomial) formats.

TABLE 2

Representation of GF(8)

| Integer | Binary | Polynomial |
|---|---|---|
| 0 | 000 | 0 |
| 1 | 001 | 1 |
| 2 | 010 | x |
| 3 | 011 | x + 1 |
| 4 | 100 | $x^2$ |
| 5 | 101 | $x^2 + 1$ |
| 6 | 110 | $x^2 + x$ |
| 7 | 111 | $x^2 + x + 1$ |

In addition, each GF can have one or more primitive polynomials, also called generator polynomials, which is analogous to a particular set of consecutive real integers. These one or more primitive polynomials include one or more prime numbers, depending upon how large is the particular set of consecutive integers. The primitive polynomials, p(x), are used to define the arithmetic functions for each GF and to ensure that each GF arithmetic operation yields a result that is part of the GF in question. For example, in GF arithmetic, as in basic arithmetic, certain mathematical properties, such as, for example, commutativity and associativity exist. Therefore, if upon determining the sum or product of any two elements within a GF, the sum or product lies outside the GF, the sum or product in question is divided by a predetermined primitive polynomial in order to preserve the GF. Table 3 lists the integer representation of known primitive polynomials for GF(8) to GF(256).

TABLE 3

Primitive polynomials for Galois Fields

| GF(x) | P(x) | GF(x) | P(x) | GF(x) | P(x) |
|---|---|---|---|---|---|
| 8 | 11 | 128 | 137 | 256 | 285 |
| 16 | 19 | 128 | 143 | 256 | 361 |
| 32 | 37 | 128 | 157 | 256 | 487 |
| 32 | 61 | 128 | 247 | 256 | 299 |
| 32 | 55 | 128 | 191 | 256 | 357 |
| 64 | 67 | 128 | 213 | 256 | 355 |
| 64 | 103 | 128 | 131 | 256 | 351 |
| 64 | 109 | 128 | 203 | 256 | 451 |
|  |  | 128 | 229 |  |  |

As shown in Table 3, there is only one primitive polynomial for GF(8) and one primitive polynomial for GF(16); this is due to the smallness of the fields in question. Respectively, the primitive polynomials are represented by the decimal number 11 (1011 binary, $x^3+x+1$ polynomial) and by the decimal number 19 (10011 binary, $x^4+x+1$ polynomial). However, GF(128) has 9 primitive polynomials and GF(256) has 8 primitive polynomials. For example, a primitive polynomial for GF(256) is 285, which corresponds to the binary number 100011101, which has the corresponding polynomial $p(x)=x^8+x^4+x^3+x^2+1$.

In general, for a given GF($2^m$) field, there exists at least one primitive polynomial which yields a multiplication result in the GF($2^m$) field. As the number of m-bit increases, the number of available primitive polynomials also increases. Galois field multiplication is difficult and time consuming for traditional digital signal processors (DSP) to perform. However, for certain data storage or encryptions systems, it may be a requirement to support multiple primitive polynomials.

Several approaches have been used in GF multiplication operations. These include a brute force approach where a GF multiplier design is simplified by using a pre-determined, fixed primitive polynomial. These types of approaches aim at reducing hardware logic, can be easily implemented and are typically used in AES encryption or Reed Solomon coding. With a given fix primitive polynomial, logic gates are easily defined and a GF multiplier design can be implemented by defining a related equation used to multiply all components of any two given input polynomials. Such approaches are usually slow.

The most commonly used approach in multiplying two values of a GF is to generate two logarithm tables, which converts the multiplication process into three lookup tables and an addition. These tables can be referred to as gflog[ ] (GF logarithm) and gfilog[ ] (GF inverse logarithm). The gflog[ ] table is defined for the indices 1 to 2m−1, and maps the index to its logarithm in the GF. As for the gfilog[ ] table, it is defined for the indices 0 to 2m−2, and maps the index to its inverse logarithm in the GF. The tables obey the rules gflog[gfilog[x]]=x, and gfilog[gflog[x]]=x. With these tables, it is possible to multiply two elements of GF($2^m$) by adding their logs and then taking the inverse log, which yields the product. The advantage of using the table lookup approach is that it supports all kinds of primitive polynomial by simply updating the lookup tables with different index mapping values. However, this approach is similar to the brute approach in that it is quite slow.

It is, therefore, desirable to provide a GF multiplier system and method that is fast and that can function with any arbitrary primitive polynomial.

SUMMARY OF THE INVENTION

It is an object of the present invention to obviate or mitigate at least one disadvantage of previous GF multiplier systems.

In a first aspect, the present invention provides a multiplier circuit for multiplying a first polynomial B(x) by a second polynomial C(x), B(x) and C(x) being part of a Galois field GF(2m) and being representable in binary format as B[m−1:0] and C[m−1:0] respectively. The multiplier circuit comprises a first sub-circuit having: a first logic gate unit having a first group of inputs, each input of the first group of inputs for receiving bit B[m−1], the first logic gate unit further having a second group of inputs, each input of the second group of inputs for receiving the bits of a primitive polynomial P(x) of GF(2m), P(x) being representable in binary format as P[m−1:0], the first logic gate unit for multiplying the first group of inputs and the second group of inputs to obtain (B[m−1]*P[m−1:0])[m−1:0]; a shifting device for receiving B[m−1:0] and for shifting by 1 bit to the left the bits of B[m−1:0] to obtain LS_B[m−1:0]; and a second logic gate unit for receiving, and for adding, (B[m−1]*P[m−1:0])[m−1:0] and LS_B[m−1:0] to obtain (B(x)*x)[m−1:0]. The multiplier circuit also comprises a second sub-circuit having: an input for receiving (B(x)*x)[m−1:0] from the first sub-circuit; inputs for receiving B[m−1:0], C[m−1:0] and P[m−1:0]; and a logic unit for calculating, in accordance with (B(x)*x)[m−1:0], B[m−1:0], C[m−1:0] and P[m−1:0], (C[k]*B(x)*xk)[m−1:0] for each value of k ranging from 0 to m−1, k being an integer, and for summing together (C[k]*B(x)*xk)[m−1:0] for k ranging from 0 to m−1, to obtain (B(x)*C(x))[m−1:0].

In an embodiment of the multiplier circuit, the first logic gate unit of the first sub-circuit includes m AND-gates, an input of each AND-gate for receiving bit B[m−1], another input of each AND-gate for receiving one of the m bits of P[m−1:0].

In another embodiment of the multiplier circuit, the shifting device of the first sub-circuit is a shift-register.

In another embodiment of the multiplier circuit, the second logic gate unit of the first sub-circuit includes m XOR-gates, an input of each XOR-gate for receiving a bit of (B[m−1]*P[m−1:0])[m−1:0], another input of each XOR gate for receiving a corresponding bit of LS_B[m−1:0].

In another embodiment of the multiplier circuit, the logic unit of the second sub-circuit has a third sub-circuit having: a third logic gate unit having a first group of inputs, each input of the first group of inputs for receiving bit (B(x)*x)[m−1] from the first sub-circuit, the third logic gate unit further having a second group of inputs, each input of the second group of inputs for receiving one of the m bits of P[m−1:0], the third logic gate unit for multiplying the first group of inputs and the second group of inputs to obtain (B(x)*x)[m−1]*P[m−1:0]; a shifting device for receiving (B(x)*x)[m−1:0] from the first sub-circuit and for shifting by 1 bit to the left the bits of (B(x)*x)[m−1:0] to obtain LS_(B(x)*x)[m−1:0]; and a second logic gate unit for receiving, and for adding, (B(x)*x)[m−1]*P[m−1:0] and LS_(B(x)*x)[m−1:0] to obtain (B(x)*x2)[m−1:0]. Further, the third logic gate unit of the first sub-circuit can include m AND-gates, an input of each AND-gate for receiving bit (B(x)*x)[m−1], another input of each AND-gate for receiving one of the m bits of P[m−1:0]. Furthermore, the shifting device of the third sub-circuit can be a shift-register.

In another embodiment, the multiplier circuit can comprise one or more than one pipeline register.

In another embodiment, a redundant array of inexpensive disk (RAID) controller can comprise the multiplier circuit.

In further aspect, the present invention provides a method for multiplying a first polynomial B(x) by a second polynomial C(x), B(x) and C(x) being part of a Galois field GF(2m) and being representable in binary format as B[m−1:0] and C[m−1:0] respectively. The method comprises steps of: multiplying bit B[m−1] by a primitive polynomial P[m−1:0] to obtain (B[m−1]*P[m−1:0])[m−1:0]; left-shifting by one bit B[m−1:0] to obtain LS_B[m−1:0]; adding (B[m−1]*P[m−1:0])[m−1:0] and LS_B[m−1:0] to obtain (B(x)*x)[m−1:0]; and, calculating, in accordance with (B(x)*x)[m−1:0], B[m−1:0], C[m−1:0] and P[m−1:0], (C[k]*B(x)*xk)[m−1:0] for each value of k ranging from 0 to m−1, k being an integer, and for summing together (C[k]*B(x)*xk)[m−1:0] for k ranging from 0 to m−1, to obtain (B(x)*C(x))[m−1:0].

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 3 shows a single stage embodiment of the Galois Field multiplier of FIG. 1.

DETAILED DESCRIPTION

Figure 1:
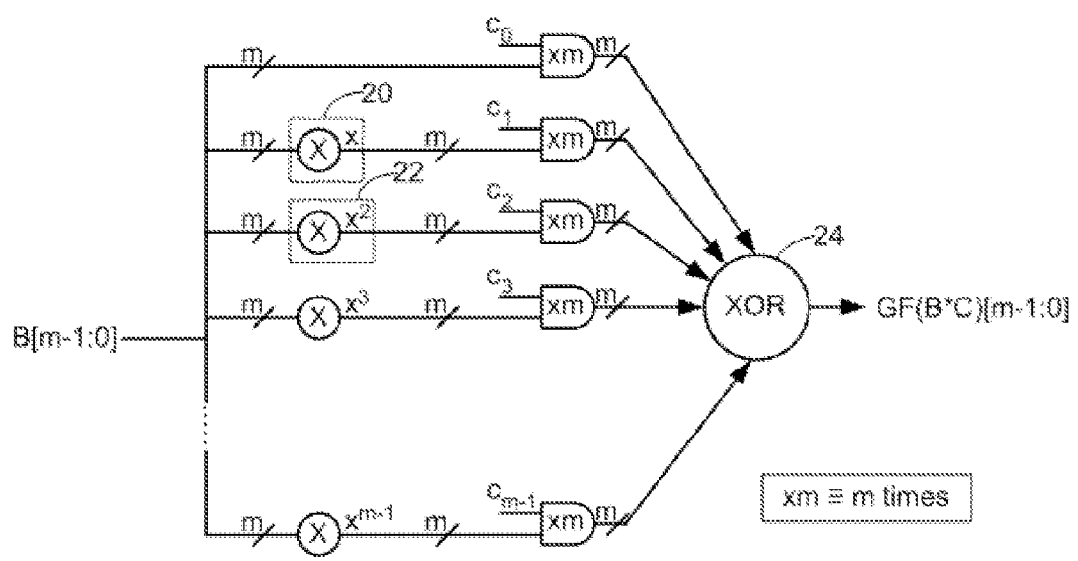
FIG. 1 shows an exemplary functional block diagram of a Galois Field multiplier of the present invention.

Generally, the present invention provides a method and system for multiplying Galois Field polynomials for any arbitrary primitive vector. This can be used in RAID controllers to implement safe data storage and retrieval schemes.

Consistent with the above-described background, GF m-bit long polynomials B and C can be written as $$B(x) = b_{m-1}x^{m-1} + b_{m-2}x^{m-2} + \ldots + b_2 x^2 + b_1 x + b_0 \quad (1)$$

$$B(x) = \sum_{i=0}^{i=m-1} b_i x^i \quad (2)$$

where the coefficient $b_i$ is either 1 or 0, $$C(x) = c_{m-1}x^{m-1} + c_{m-2}x^{m-2} + \ldots + c_2 x^2 + c_1 x + c_0 \quad (3)$$

$$C(x) = \sum_{i=0}^{i=m-1} c_i x^i \quad (4)$$

where the coefficient $b_i$ is either 1 or 0. As will be understood by the skilled worker, C(x) and B(x) can be expressed respectively as B[m−1:0] and C[m−1:0].

Similarly, an m-bit long primitive polynomial P can be defined as $$P(x) = p_{m-1}x^{m-1} + p_{m-2}x^{m-2} + \ldots + p_2 x^2 + p_1 x + p_0 \quad (5)$$

$$P(x) = \sum_{i=0}^{i=m-1} p_i x^i \quad (6)$$

where the coefficient $p_i$ is either 1 or 0.

With the above definition of polynomials B and C, and of the primitive polynomial P, a GF multiplication operation is defined such that B*C satisfy $$GF(B \cdot C) \in GF(2^m) \quad (7)$$

through the identity $$x^m = P(x) = \sum_{i=0}^{i=m-1} p_i x^i \quad (8)$$

that transforms an (m+1)-bit element ($x^m$) into an m-bit element (P(x)) in order to preserve the GF.

Using the definitions above, the product of B and C in Galois Field domain can be written as follows $$GF(B \cdot C) = B(x) * C(x) \quad (9)(10)$$

$$= B(x) * \sum_{i=0}^{i=m-1} c_i x^i$$

$$= \sum_{i=0}^{i=m-1} c_i B x^i$$

$$= c_{m-1} \cdot B \cdot x^{m-1} + c_{m-2} \cdot B \cdot x^{m-2} + \ldots + c_2 \cdot B \cdot x^2 + c_1 \cdot B \cdot x + c_0 \cdot B$$

where the coefficient $c_i$ is either 1 or 0 and where B(x)*C(x) can be expressed as (B(x)*C(x))[m−1:0].

The product B*x can be expanded as follows:

$$B \cdot x = x \cdot (b_{m-1}x^{m-1} + b_{m-2}x^{m-2} + \ldots + b_2 x^2 + b_1 x + b_0) \quad (11)$$

$$= x \cdot \sum_{i=0}^{i=m-1} b_i x^i$$

$$= \sum_{i=0}^{i=m-1} b_i x^{i+1}$$

$$= b_{m-1}x^m + b_{m-2}x^{m-1} + \ldots + b_2 x^3 + b_1 x^2 + b_0 x$$

$$= b_{m-1} \cdot P + (b_{m-2}x^{m-1} + \ldots + b_2 x^3 + b_1 x^2 + b_0 x)$$

$$= b_{m-1} \cdot P + \sum_{i=1}^{i=m-1} b_{i-1} x^i$$

$$= b_{m-1} \cdot P + (B \text{ shift left by 1-bit})$$

$$= \begin{cases} P + LS\_B & \text{if } b_{m-1} = 1, \\ LS\_B & \text{if } b_{m-1} = 0 \end{cases}$$

Where equation (8) has been used and with LS_B meaning that the polynomial B has been shifted by 1 bit to the left. As will be understood by the skilled worker, LS_B can be expressed as LS_B[m−1:0]. As will be understood by the skilled worker the plus signs (+) used above are to be interpreted as XOR operations (⊕).

Thus, the computation of the B*C product can be broken down into 3 steps: (a) find the product of $Bx^i$ which involves (m−1) constant multiplication operations done in parallel (this is represented by equation 11 and is referred to as P-box logic, which is shown in greater detail at FIG. 2); (b) find the product of $c_i(Bx^i)$ which involves AND-ing the value of $c_i$ with the value $Bx^i$ given that $c_i$ is a 1-bit number and can only be either 1 or 0; and (c) sum together all the products found in the step (b). This involves XOR-ing all the $c_i(Bx^i)$ m-bit vectors. The result of the summation is the product B*C.

FIG. 1 shows an exemplary embodiment of a functional block diagram for a $GF(2^m)$ multiplier of the present invention. The P-box logic or function is defined by equation (11) and is shown at reference numeral 20. This P-box logic uses the primitive polynomial (equation 8), which can be arbitrary, to perform the modulo operation defined by equation 11. The output of operation 20, B(x)*x, is equal to B(x) left-shifted by 1 bit (LS_B(x)) if $b_{m-1}=0$ or, is equal to the XOR-addition of the primitive polynomial and of LS_B(x). The output of operation 22 is equal to the result of operation 20 multiplied by x. Thus, the P-box output needs to be fed forward as input to the next P-box stage. The final result of all the $B*x^i$ operations (i=0 to m−1) are XOR-ed together to form the GF multiplication output. This step is shown at reference numeral 24.

Figure 2:
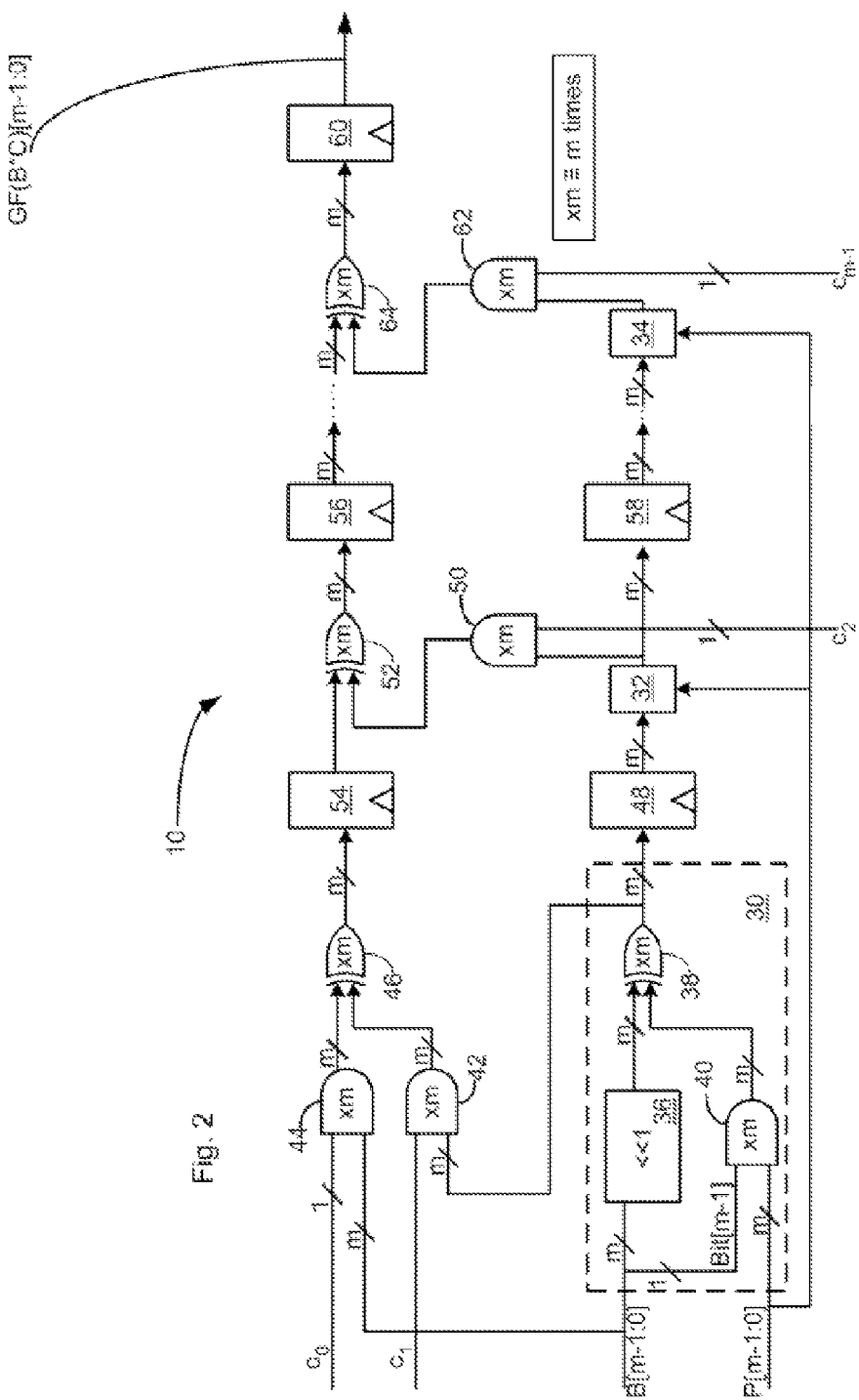
FIG. 2 shows a multi-stage embodiment of the Galois Field multiplier of FIG. 1.

FIG. 2 shows an exemplary embodiment of a GF multiplier 10 of the present invention in a multi-stage pipeline design. The design comprises a plurality of functional units labeled as 30, 32 and 34, which can all perform the same functions, including those depicted for the functional unit 30. In accordance with equation 11, the functional unit 30 includes a shift register 36, or any other suitable type of shifting device, that receives the B[m−1:0] input vector and shifts of the input vector by 1 bit to the left to produce LS_B[m−1:0]. That is, bit 1 of B[m−1:0] becomes bit 0, bit 2 of B[m−1:0] becomes bit 1, etc. The output of the shift register 36, i.e., LS_B(x) (LS_B[m−1:0]), is sent to m XOR gates shown as XOR-gate unit 38, or to any other suitable type of logic gate unit. The functional unit 30 also comprises m AND gates shown as AND-gate unit 40, or any other suitable type of logic gate unit, that receives Bit[m−1] of the B[m−1:0] input vector and the arbitrary input primitive polynomial P[m−1:0]. The outputs of the AND gate unit 40, which are either 0 or P[m−1:0], are sent to the XOR-gate unit 38 where they are XOR-ed with the outputs of the shift register 36.

The GF multiplier 10 of FIG. 2 also includes m AND gates shown as AND-gate unit 42, or any other suitable type of logic gate unit, that receives the m outputs of XOR-gate unit 38, i.e., the outputs of the functional unit 30, and multiplies them by $c_1$. The outputs of the AND-gate unit 42 corresponds to the bits of the term $c_1*B*x$ of equation (10). The GF multiplier 10 further includes m other AND gates shown as AND-gate unit 44, or any other suitable type of logic gate unit, that receives as input $c_0$ and the m bits of vector B[m−1:0]. The outputs of the AND-gate 44 unit are then XOR-ed at m XOR gates shows as XOR-gate unit 46, or by any other suitable type of logic gate unit, with the outputs of the AND-gate unit 42. The outputs of the XOR-gate unit 46 correspond to the bits of the term $(c_0*B+c_1*B*x)$ of equation (10).

The output of the functional unit 30 is also provided, as an input vector, to the functional unit 32 through an optional pipeline register 48, the presence of which is decided, as would be understood by the skilled worker, in accordance with the timing margin of the GF multiplier 10. The functional unit 32 also receives the primitive polynomial P[m−1:0] and performs the same functions as the functional unit 30. The output of the functional unit 32, which is equal to B(x)*$x^2$, is provided as input to m AND gates shown as AND-gate unit 50, or to any other suitable type of logic gate unit, that receives $c_2$ as another input. The outputs of the AND-gate unit 50 correspond to the bits of the term $c_2*B*x^2$ of equation (10). The outputs of the AND-gate unit 50 is XOR-ed at m XOR gates shown as XOR-gate unit 52, or at any other suitable type of logic gate unit, with the outputs of XOR-gate unit 46. The outputs of the XOR-gate unit 52 correspond to the bits of the term $(c_0*B+c_1*B*x+c_2*B*x^2)$ of equation (10). The outputs of XOR-gate unit 46 can be provided to the inputs of XOR-gate unit 52 through an optional pipeline register 54.

The GF multiplier 10 further includes optional pipeline registers 56, 58 and 60; AND-gate unit 62; XOR-gate unit 64; and, as mentioned above, the functional unit 34. As will be understood by the skilled worker, the outputs of the AND-gate unit 62 correspond to the bits of the term $c_{m-1}*B*x^{m-1}$ of equation (10), and the output of XOR-gate unit 64 corresponds to GF(B*C). As will be understood by the skilled worker, the AND-gate unit 62 and the XOR-gate unit 64 can be replaced by any other suitable logic gate units.

FIG. 3 shows a single stage multiple-cycle embodiment GF multiplier of the present invention. The single stage GF multiplier (SSGFM) 70 includes a functional unit 72 that functions in the same way as the functional unit 30 described above with respect to FIG. 2. The SSGFM 70 also includes a counter unit 74 for counting from 0 to m−2, m being the relevant number of bits. The counter unit 74 is such that it produces an output equal to "1" when the count value is "0", and produces an output equal to "0" when the count value is different from zero, i.e., it produces an output equal to "0" when the count value is comprised within the range [1, m−2]. With reference to FIG. 3, upon the counter unit 74 having a count value of "0", the value at output of the counter unit 74, which is equal to the input of multiplexer (MUX) 76, is set to "1" and the value at an input of an OR-gate 78, i.e. at the output of inverter 79, is set to "0", which result in the output of MUX 76 being B[m−1:0], and in the output of OR-gate 78 being equal to $c_0$. Further, upon the counter unit 74 having a count value of "0", the shift register 80 outputs the value $c_1$, which acts as an input to AND-gate unit 82, and multiplexer 84 outputs the vector B[m−1:0] to functional unit 72, the other input of which is the primitive polynomial P[m−1:0]. The functional units outputs the value B*x, which acts as the other input to AND-gate unit 82. Therefore, the outputs of the AND-gate unit 82 are, upon the counter unit 74 having its count value set to "0", the bits of $c_1*B*x$. These outputs act an inputs to XOR-gate unit 86, the other inputs of which are the outputs of AND-gate unit 88, namely, the bits of $c_0*B$. Thus, the outputs of the XOR-gate unit 86, upon the bit counter unit 74 having a count value of "0", is equal to the bits of $c_1*B*x+c_0*B$.

Upon the counter unit 74 having a count value equal to "1", its output is equal to "0", which means that the bits at the inputs of the OR-gate 78 become $c_0$ and "1", which in turn means that the output of OR-gate 78 is 1, regardless of the value of $c_0$, and the multiplexer 76 outputs the value $c_1*B*x+c_0*B$, which was calculated while the counter unit 74 has a count value of "0". Further, upon the counter unit 74 having a count value of "1", the multiplexer 84 outputs the value B*x produced by the functional unit 72 when the counter unit 74 had a count value of "0" and, the shift register 80 outputs the value $c_2$. This results in the output of functional unit 72 being $B*x^2$, the output of AND-gate unit 82 being $c_2*B*x^2$, and the output of XOR-gate unit 86 being $c_2*B*x^2+c_1*B*x+c_0*B$.

Upon the counter unit 74 being in the range [2, m−2], the bit at the inputs of OR-gate 78 remains $c_0$ and "1", and, consequently, the output of OR-gate 78 remains "1". Further, the respective outputs of multiplexers 76 and 84 become the output values of the XOR-gate unit 86 and of the functional unit 72 calculated in the previous cycle. Ultimately, upon the counter 74 reaching the value "m−2", the output of XOR-gate 86 becomes equal to equation (10), i.e., becomes equal to the GF multiplication of vectors B and C, and, a data_valid signal is generated by the counter unit 74 to signify that the multiplication in question is complete. As in the GF multiplier 10 of FIG. 2, the SSGFM 70 can include registers 90, 92 and 94 depending on the associated timing margin of the SSGFM 70. As will be understood by the skilled worker, the OR-gate 78, the XOR-gate unit 86, and the AND-gate units 82, 88 can be replaced by any other suitable type of logic gate or logic gate unit without departing from the scope of the invention.

As will be understood by the skilled worker, the SSGFM 70 can be modified by adding more functional units, such as functional unit 72, to increase the throughput of the design.

As will also be understood by the skilled worker, the embodiments of the GF multipliers described herein can be implemented through programming of a digital signal processor through any suitable hardware description language such as, for example, VHDL ("Very-High-Speed Integrated Circuit" Hardware Description Language).

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

Embodiments of the invention can be represented as a software product stored in a machine-readable medium (also referred to as a computer-readable medium, a processor-readable medium, or a computer usable medium having a computer-readable program code embodied therein). The machine-readable medium can be any suitable tangible medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention can also be stored on the machine-readable medium. Software running from the machine-readable medium can interface with circuitry to perform the described tasks.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A multiplier circuit for multiplying a first polynomial $B(x)$ by a second polynomial $C(x)$, $B(x)$ and $C(x)$ being part of a Galois field $GF(2^m)$ and being representable in binary format as $B[m-1:0]$ and $C[m-1:0]$ respectively, the multiplier circuit comprising:
   a first sub-circuit having:
      a first logic gate unit having a first group of inputs, each input of the first group of inputs for receiving bit $B[m-1]$, the first logic gate unit further having a second group of inputs, each input of the second group of inputs for receiving the bits of a primitive polynomial $P(x)$ of $GF(2^m)$, $P(x)$ being representable in binary format as $P[m-1:0]$, the first logic gate unit for multiplying the first group of inputs and the second group of inputs to obtain $(B[m-1]*P[m-1:0])[m-1:0]$;
      a shifting device for receiving $B[m-1:0]$ and for shifting by 1 bit to the left the bits of $B[m-1:0]$ to obtain $LS\_B[m-1:0]$; and
      a second logic gate unit for receiving, and for adding, $(B[m-1]*P[m-1:0])[m-1:0]$ and $LS\_B[m-1:0]$ to obtain $(B(x)*x)[m-1:0]$;
   and,
   a second sub-circuit having:
      an input for receiving $(B(x)*x)[m-1:0]$ from the first sub-circuit;
      inputs for receiving $B[m-1:0]$, $C[m-1:0]$ and $P[m-1:0]$; and
      a logic unit for calculating, in accordance with $(B(x)*x)[m-1:0]$, $B[m-1:0]$, $C[m-1:0]$ and $P[m-1:0]$, $(C[k]*B(x)*x^k)[m-1:0]$ for each value of k ranging from 0 to m−1, k being an integer, and for summing together $(C[k]*B(x)*x^k)[m-1:0]$ for k ranging from 0 to m−1, to obtain $(B(x)*C(x))[m-1:0]$.

2. The multiplier circuit of claim 1 wherein the first logic gate unit of the first sub-circuit includes m AND-gates, an input of each AND-gate for receiving bit $B[m-1]$, another input of each AND-gate for receiving one of the m bits of $P[m-1:0]$.

3. The multiplier circuit of claim 1 wherein the shifting device of the first sub-circuit is a shift-register.

4. The multiplier circuit of claim 1 wherein the second logic gate unit of the first sub-circuit includes m XOR-gates, an input of each XOR-gate for receiving a bit of $(B[m-1]*P[m-1:0])[m-1:0]$, another input of each XOR gate for receiving a corresponding bit of $LS\_B[m-1:0]$.

5. The multiplier circuit of claim 1 wherein the logic unit of the second sub-circuit has a third sub-circuit having:
   a third logic gate unit having a first group of inputs, each input of the first group of inputs for receiving bit $(B(x)*x)[m-1]$ from the first sub-circuit, the third logic gate unit further having a second group of inputs, each input of the second group of inputs for receiving one of the m bits of $P[m-1:0]$, the third logic gate unit for multiplying the first group of inputs and the second group of inputs to obtain $(B(x)*x)[m-1]*P[m-1:0]$;
   a shifting device for receiving $(B(x)*x)[m-1:0]$ from the first sub-circuit and for shifting by 1 bit to the left the bits of $(B(x)*x)[m-1:0]$ to obtain $LS\_(B(x)*x)[m-1:0]$; and
   a second logic gate unit for receiving, and for adding, $(B(x)*x)[m-1]*P[m-1:0]$ and $LS\_(B(x)*x)[m-1:0]$ to obtain $(B(x)*x^2)[m-1:0]$.

6. The multiplier circuit of claim 5 wherein the third logic gate unit of the first sub-circuit includes m AND-gates, an input of each AND-gate for receiving bit $(B(x)*x)[m-1]$, another input of each AND-gate for receiving one of the m bits of $P[m-1:0]$.

7. The multiplier circuit of claim 6 wherein the shifting device of the third sub-circuit is a shift-register.

8. The multiplier circuit of claim 1 further comprising one or more than one pipeline register.

9. A redundant array of inexpensive disk (RAID) controller comprising the multiplier circuit of claim 1.

10. A method for multiplying a first polynomial $B(x)$ by a second polynomial $C(x)$, $B(x)$ and $C(x)$ being part of a Galois field $GF(2^m)$ and being representable in binary format as $B[m-1:0]$ and $C[m-1:0]$ respectively, the method comprising steps of:
   multiplying bit $B[m-1]$ by a primitive polynomial $P[m-1:0]$ to obtain $(B[m-1]*P[m-1:0])[m-1:0]$;

left-shifting by one bit $B[m-1:0]$ to obtain $LS\_B[m-1:0]$;
adding $(B[m-1]*P[m-1:0])[m-1:0]$ and $LS\_B[m-1:0]$ to obtain $(B(x)*x)[m-1:0]$;
and,
calculating, in accordance with $(B(x)*x)[m-1:0]$, $B[m-1:0]$, $C[m-1:0]$ and $P[m-1:0]$, $(C[k]*B(x)*x^k)[m-1:0]$ for each value of k ranging from 0 to m−1, k being an integer, and for summing together $(C[k]*B(x)*x^k)[m-1:0]$ for k ranging from 0 to m−1, to obtain $(B(x)*C(x))[m-1:0]$.

* * * * *